Sept. 22, 1970 L. R. SMITH 3,530,390

OPERATIONAL AMPLIFIER WITH VARACTOR BRIDGE INPUT CIRCUIT

Original Filed Dec. 28, 1966 4 Sheets-Sheet 1

INVENTOR.

BY LEWIS R. SMITH

Alfred W. Barber

ATTORNEY

OPERATIONAL AMPLIFIER WITH VARACTOR BRIDGE INPUT CIRCUIT

Original Filed Dec. 28, 1966

INVENTOR.

LEWIS R. SMITH

BY Alfred W. Barber

ATTORNEY

INVENTOR.
LEWIS R. SMITH
BY
Alfred W. Barber
ATTORNEY

Sept. 22, 1970 L. R. SMITH 3,530,390

OPERATIONAL AMPLIFIER WITH VARACTOR BRIDGE INPUT CIRCUIT

Original Filed Dec. 28, 1966 4 Sheets-Sheet 4

INVENTOR.
LEWIS R. SMITH
BY
Alfred W. Barber
ATTORNEY

United States Patent Office 3,530,390
Patented Sept. 22, 1970

3,530,390
OPERATIONAL AMPLIFIER WITH VARACTOR BRIDGE INPUT CIRCUIT

Lewis R. Smith, Sudbury, Mass., assignor to Analog Devices, Inc., Cambridge, Mass.

Continuation of application Ser. No. 605,451, Dec. 28, 1966. This application July 16, 1969, Ser. No. 846,634
Int. Cl. H03f *1/02, 3/38*
U.S. Cl. 330—9 1 Claim

ABSTRACT OF THE DISCLOSURE

A modulator-demodulator circuit for producing a stabilized amplifier including a varactor bridge circuit as the input circuit. The bridge comprises voltage variable capacitor diodes and helps maintain the carrier from the carrier oscillator and any carrier present on the input leads balanced at the input to the AC amplifier. Improved temperature stability and wide band frequency response is obtained by the use of an untuned transformer coupling the modulator to the AC amplifier and temperature drift compensating network including a balancing impedance connected to the DC output amplifier.

This is a continuation of application 605,451, filed Dec. 28, 1966.

The present invention concerns varactor bridge input modulator operational amplifiers and the like.

The term operational amplifier describes a DC amplifier of high gain and controlled phase shift capable of operation with large amounts of degenerative feedback. Operational amplifiers are constructed either single ended or differential depending on the intended application. Generalizing, a typical operational amplifier is provided with two input terminals and one ouput terminal. One of the inputs has a polarity or phase opposite to the output terminal and is called the inverting input. Degenerative feedback circuits are usually connected from the output terminal to the inverting input terminal. The second input terminal has the same phase or polarity as the output and is called the non-inverting input, for a more complete understanding of the basic principles and applications of operational amplifiers reference is made to September and November 1965 issues of Electromechanical Design pp. 48–58 and pp. 38–43 respectively.

The form of operational amplifier in accordance with the present invention is made up of five main components; a bridge modulator, a carrier oscillator, an AC amplifier, a demodulator and a DC amplifier. Such an amplifier as with other operational amplifiers, accepts a DC input signal and provides an amplified DC output. Briefly, this amplifier operates as follows: carrier frequency voltage and DC input signals are simultaneously applied to the bridge modulator producing a modulated carrier frequency output; this modulated carrier output signals is amplified by the AC amplifier; the AC amplifier output is demodulated in the demodulator providing a DC signal which is an amplified form of the input signal; and finally this latter DC signal is further amplified in the DC amplifier to provide the final output signal. This amplifier is provided with the usual inverting and noninverting input terminals. Feedback impedance is connected from the output to the inverting input to provide desired closed loop performance.

In accordance with the present invention the non-linear elements employed in the input modulator bridge are voltage variable capacitor diodes. It has been found possible to provide a double balanced bridge in the input modulator so that both carrier from the carrier oscillator and any carrier present on the input leads are balanced at the input to the AC amplifier. The input bridge modulator is an RC bridge providing improved balance characteristics. It has been found possible to provide a substantial power gain in this modulator. Improved temperature stability and wide band frequency response in the modulator are provided by using an untuned transformer for coupling the modulator to the AC amplifier. It has also been found possible to provide an additional degree of balance by means of controlling the gain of one of the DC amplifier stages which may conveniently be accomplished by a remote control not possible with previous balancing systems. In addition means are provided for preventing lock-up of the DC amplifier in the presence of large over load signals.

Accordingly, one object of the present invention is to provide an improved bridge circuit in an input bridge modulator operational amplifier.

Another object is to provide greater bandwidth in an input bridge modulator type of DC to DC amplifier.

A further object is to provide improved temperature stability and wide frequency response in an input bridge modulator operational amplifier.

A still further object is to provide a method of and means for balancing an input bridge modulator operational amplifier by means of a remote control device.

Still another object is to provide a method of and means for preventing lock-up in an input bridge modulator operational amplifier.

These and other objects will be apparent from the detailed description of the invention given in connection with the various figures of the drawing.

Figure 1:
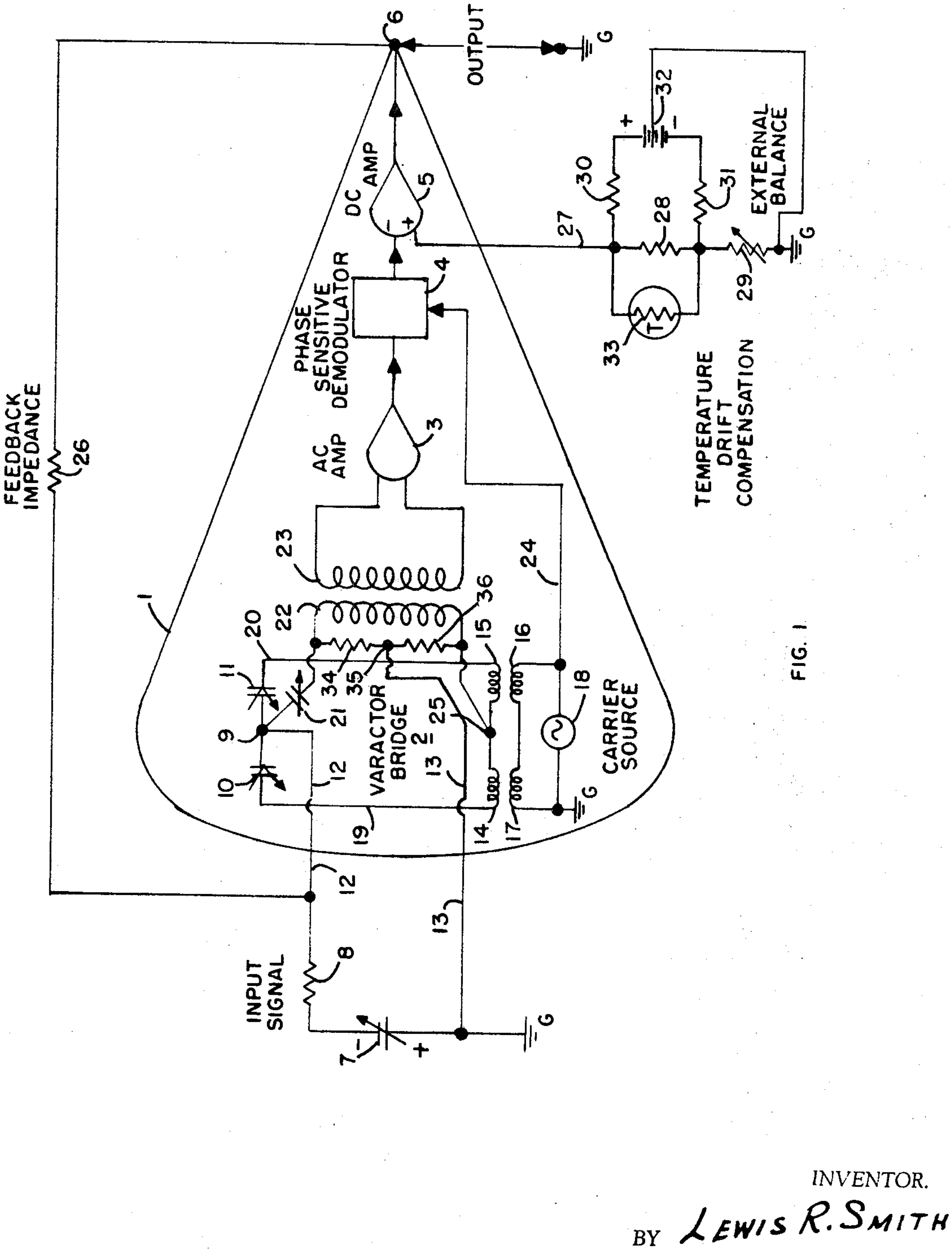
FIG. 1 is a simplified block diagram of one form of the present invention.

FIG. 1 is a simplified block diagram of one form of the present invention wherein the details of one form of the input varactor bridge are shown. The entire device 1 includes the input varactor bridge to be described in detail below, the source of carrier signal 18, AC amplifier 3, phase sensitive demodulator 4 and DC amplifier 5. The input varactor bridge comprises carrier signal center tapped secondary 14–15 shunted by the voltage sensitive varactor capacitor diodes 10 and 11 connected in series over leads 19 and 20. The primary 22 of the bridge to AC amplifier transformer 22–23 is connected between center tap 25 and variable capacitor 21 which in turn is connected to junction 9 between varactor capacitors 10 and 11. The DC input 7 is connected over lead 13 to junction 35 between equal resistors 34 and 36 which in turn bridged across primary 22 of AC transformer 22–23 and through input resistor 8 and over lead 12 to junction point 9. The bridge circuit thus formed is, in effect, two bridges in one or a so called dual bridge.

The first or principal bridge of FIG. 1 is provided to balance the carrier input across secondary 14–15 as induced from primary 16–17 connected to the carrier source 18 so that substantially no carrier frequency voltage appears across primary 22. The four arms of this principal bridge comprise coils 14 and 15 and varactor capacitors 10 and 11 connected in a closed loop by means of conductors 19 and 20. The DC input signal is effectively connected between diagonal junction points 9 and 25. One side of the DC input passes over conductor 12 directly to junction point 9. The other side of the DC input is effectively connected to junction point 25 over conductor 13 and through resistors 34 and 36 effectively in parallel, primary 22 providing a relatively low DC resistance path. The balanced output which contains substantially no carrier but does receive the modulation products comprises primary 22 connected between junction point 25 and, through DC blocking capacitor 21, to junction point 9. In operation, the DC signals from source 7 by changing the effective DC bias on varactor diodes 10 and 11, unbalance this bridge and modulation products appear across primary 22 which induce corresponding signals in secondary 23 which are applied to AC amplifier 3. Opposite terminals of the two varactor diodes 10 and 11 are connected to junction point 9 so that the DC input applied to this point causes the effective capacity of one diode to increase and the other to decrease and vice versa. This may be considered a type of push-pull action and the result is an unbalancing of the primary bridge described above and a resulting output to the AC amplifier.

The secondary bridge balance is provided to eliminate carrier frequency signals which may be picked up by, induced in or fed back to the input circuit along with the DC input signals. The elimination of carrier fed back from the output provides a system capable of greater bandwidth since it stabilizes the unity gain cross-over point. This secondary bridge is effectively four arms comprising the two varactor diode capacitances in parallel, capacitor 21, resistor 34 and resistor 36. This secondary bridge is balanced when the two diode capacitances in parallel is to capacitor 21 as resistor 34 is to resistor 36. The effective input terminals of this secondary bridge circuit are terminals 9 and 35, the first being the junction between varactor diodes 10 and 11 and the second being the junction between resistors 34 and 36. In considering this secondary bridge, secondary coils 14 and 15 are assumed to have a low impedance with respect to the effective impedance of varactor diodes 10 and 11 so that these diodes can be assumed to be effectively connected in parallel. The input diagonal of this secondary bridge is between junction points 9 and 35 and the output diagonal is across resistors 34 and 35 in series, i.e. the points to which primary 22 is connected. The bridge is balanced, as was staated above, when the capacitances of varactor diodes 10 and 11 in parallel is equal to the capacitance of capacitor 21 and the resistances of resistors 34 and 36 are equal and under these conditions carrier voltage across the input leads or circuit is balanced out so that it does not appear across primary 22 and consequently is not applied to the input of AC amplifier 3.

This double bridge balance results in an overall extremely sharp balance with substantially no carrier signal reaching the input of AC amplifier 3, even when carrier is present at the output, and is fed back over the feedback path. Under these conditions very high gain can be used in the AC amplfier and following DC amplifier resulting in a high degree of sensitivity for the system. The double balanced bridge modulator in itself provides power gain to the impedance ratio between input and output. The input is a DC circuit and is blocked for common mode DC with a resulting very high DC input impedance by the high DC resistances of varactor diodes 10 and 11 and blocking capacitor 21. The output impedance of the double bridge is relatively low consisting of the effective input impedance of transformer 22–23 as viewed from the primary in parallel with capacitor 21 in series with the varactor diodes 10 and 11 in parallel. The power gain of this double balanced modulator is a function of the impedance ratio between input and output circuits and the higher this ratio the higher the effective power gain.

The modulation products from the double bridge are amplified by AC amplifier 3 and are demodulated by phase sensitive demodulator 4. Carrier voltage to assist the demodulation process is derived from carrier oscillator 18 and applied over conductor 24. The demodulation process results in a DC voltage which is a greatly amplified facsimile of the DC input signals and this is applied to DC amplifier 5 where further amplification takes place. The finally amplified signals appear between output terminal 6 and ground point G. The phasing of the system as described above is carried out so that output terminal 6 is 180 degrees out of phase with input conductor 12. Thus, a degenerative feedback circuit as represented by impedance 26 can be connected from output terminal 6 to input conductor 12 to determine the desired closed loop gain of the system.

In accordance with the present invention a novel further balancing circuit is provided connected to the DC amplifier over conductor 27. The exact mode of operation will be described in detail below in connection with FIG. 3. One form of external balance circuit is shown here connected to the DC amplifier 5 over lead 27 and including resistors 28 and 29 in series to ground G. Resistor 29 is made adjustable so that the balance can be varied to bring a particular amplifier to exact balance. In order to compenste for temperature drift of the balance, a current from a suitable source such as battery 32 is applied through resistor 28 over current limiting resistors 30 and 31. A suitable temperature sensitive resistor 33 is then shunted across resistor 28. It has been found that this circuit connected to the proper point in DC amplifier 5, as will be set forth specifically below, permits an additional fine balance of the system. One important advantage of this additional balance circuit is that it operates in the DC amplifier circuit and hence can be placed at a remote position over a relative long lead path. The input bridge balancing circuits which carry high frequency signals must be connected over very short leads and are generally built-in since lead length and placement are critical at high frequencies.

Figure 2:
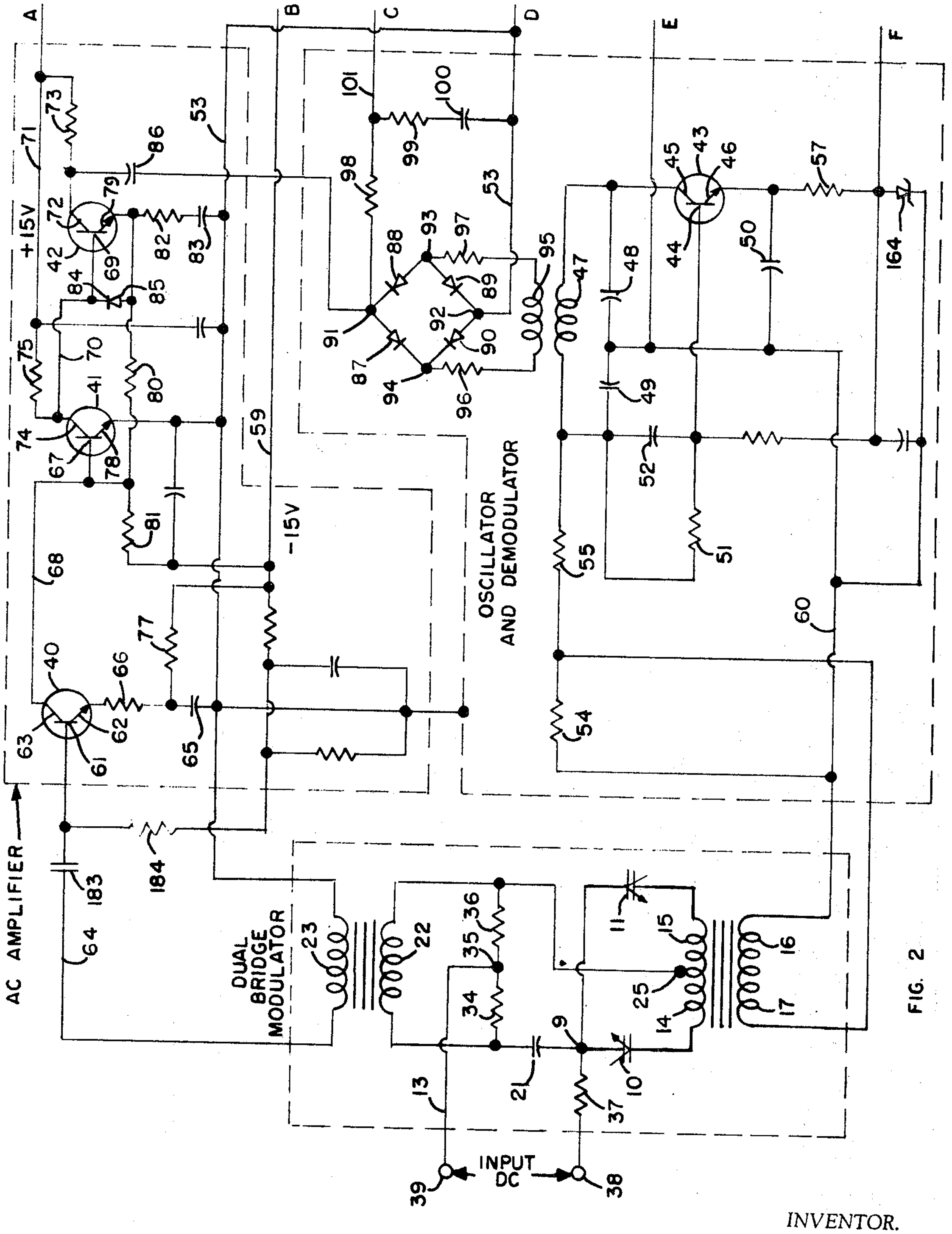
FIG. 2 is a detailed schematic circuit diagram of the input bridge modulator, carrier oscillator, AC amplifier and phase sensitive demodulator portion of one form of the present invention.
Figure 3:
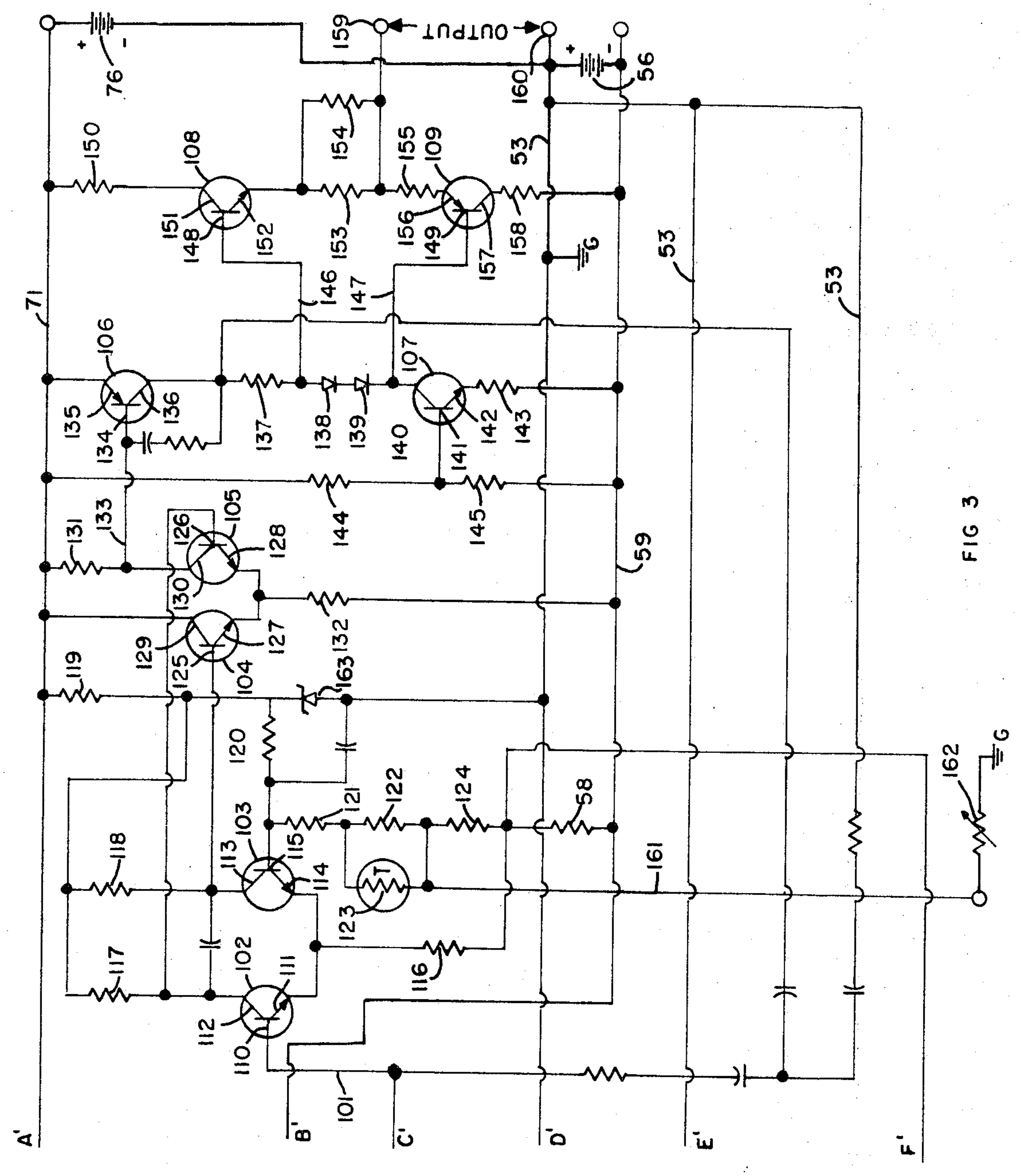
FIG. 3 is a detailed schematic circuit diagram of the balance of the form of the present invention the first portion of which is shown in FIG. 2 comprising the DC amplifier, remote balancing circuit and anti lock-up circuit.

FIGS. 2 and 3 are detailed schematic circuit diagrams which together comprise a complete circuit of one form of the present invention and a form for which FIG. 1 is essentially the simplified block diagram. FIG. 2 includes details of the varactor bridge, also shown in detail in FIG. 1, the carrier frequency oscillator, the AC amplifier and the demodulator. FIG. 3 includes details of the DC amplifier and the additional balance circuit, the latter have been described above.

FIG. 2 will now be described in detail. The dual bridge modulator is shown bearing the same numerical designations as in FIG. 1 above. In FIG. 2 one additional provision is shown in the form of resistor 37 connected in series with one of the input leads and internal to the modulator. The purpose of resistor 37 to provide high frequency carrier isolation so that the carrier currents in the bridge circuit will not be fed out to external circuitry connected to the input terminals 38 and 39. It will be seen that there is no DC circuit connection between the input terminals 38 and 39 and any of the circuits beyond the dual bridge. This permits high common mode voltages to be applied to the input terminals the maximum values depending on the insulation of the transformer secondaries 14 and 15 and primary 22.

FIG. 2 also shows the carrier oscillator which employs an oscillator transistor 43 including base 44, collector 45 and emitter 46. The oscillator circuit is of the Hartley type comprising tank coil 47 tuned by capacitors 48 and 49 in series connected across tank 47. The common connection between tank 47 and capacitor 48 is connected to collector 45. The junction between capacitors 48 and 49 is returned to emitter 46 over DC blocking capacitor 50. The common connection between tank 47 and capacitor 49 is returned to base 44 through base bias resistor 51 bypassed by capacitor 52. The DC operating bias applied to transistor 43 maintains collector 45 positive with respect to emitter 46 as required by its NPN configuration. This is accomplished by applying a negative bias to emitter 46. Collector 45 is returned to common line 53 (see FIG. 3) at the junction between capacitors 48 and 49 and through coils 16 and 17, resistors 54 and 55 and coil 47. Emitter 46 is maintained at a negative bias with respect to the collector and common line 53 by its return through resistor 57 to line F, the voltage of which is regulated by Zener 164. Carrier voltage is applied to the bridge circuit through transformer 14–15–16–17. Primary 16–17 is coupled to the oscillator over common line conductor 60 coupled to emitter 46 by means of capacitor 50 and through resistor 55 which with resistor 54 divides the voltage from one end of tank coil 47.

FIG. 2 shows the details of the AC amplifier utilizing transistors 40, 41 and 42. The first transistor 40 of the AC amplifier includes base 61, emitter 62 and collector 63. The output of the dual bridge across primary 22 induces signals in secondary 23 which are applied between base 61 and emitter 62 over conductor 64 through capacitor 165 and through capacitor 65 and resistor 66. Bias to base 61 is supplied through resistor 166. The signals amplified by transistor 40 are applied to base 67 of transistor 41 over conductor 68. Similarly, signals amplified by transistor 41 are applied to base 69 of transistor 42 over conductor 70. A positive bias from bias source 76 (see FIG. 3) is applied over conductor 71 to collector 72 through collector load resistor 73 and to collector 74 through collector load resistor 75. Emitter 62 operates at a voltage determined by emitter current flowing through resistors 66 and 77 and the voltage on the negative line 59. Emitter resistor 77 is bypassed by capacitor 65, however, resistor 66 is unbypassed so that the degeneration it provides stabilizes the gain of transistor 40. Emitter 78 is returned to common line 53. Emitter 79 is returned to negative line 59 through resistors 80 and 81 and thus operates at a voltage depending on the emitter current, the values of these resistors and the voltage on negative line 59. An intermediate voltage between the bias on emitter 79 and negative line 59 which appears at the junction between resistors 80 and 81 supplies operating bias to both collector 63 over conductor 68 and base 67. This latter connection is also degenerative as far as the signal amplification is concerned providing stabilization of amplifying transistors 41 and 42. The amount of the gain produced by transistor 42 as well as the amount of degenerative feedback provided from emitter 79 to base 67 is controlled by resistor 82 in series with capacitor 83 which in turn is connected to common line 53. The amplified signals appearing at collector 72 are applied to the demodulator through coupling capacitor 86.

An important provision in this AC amplifier is its antilockup circuit. A very strong signal passing through this amplifier may produce a condition known as lockup if the last stage of the AC amplifier overloads producing phase shift which in turn disturbs the overall phase conditions of the amplifier. This can happen if capacitor 83 charges to too high a voltage and so, to prevent this condition diode 84–85 is connected from base 69 to emitter 79 in reverse direction to the base to emitter diode 69–79. In effect, any tendency to block in transistor 42 due to charge on capacitor 83 is countered by a voltage in opposition due to conduction in diode 84–85 tending to charge capacitor 83 in the reverse direction.

FIG. 2 also shows the detailed circuitry of the demodulator. The demodulator, for example, comprises a rectifier bridge made up of diode rectifiers 87, 88, 89 and 90. The amplified signal is applied to this bridge rectifier between diagonal terminals 91 and 92. Terminal 91 is coupled to the output of the AC amplifier by capacitor 86 and terminal 92 is connected to common line 53. The carrier signal is derived from oscillator tank coil 47 by means of coupled coil 95 and is applied to diagonal terminals 93 and 94 through resistors 97 and 96 respectively. The operation of the demodulator bridge rectifier can be considered as a phase-sensitive demodulator since it depends on the interaction between the carrier applied from the oscillator and the amplified input bridge unbalance signals from the AC amplifier. The demodulation process results in a DC signal between terminals 91 and 92 which is applied over conductor 101 to the DC amplifier (see FIG. 3) after passing through a low-pass filter comprising series resistor 98 and shunt resistor 99 in series with shunt capacitor 100. This DC signal on conductor 101 is a greatly amplified facsimile of the DC signal applied to input terminals 38 and 39. It will be seen that while both input and output signals are DC, that there is actually no DC coupling in the system as so far described and, hence, high amplification of a DC signal has been accomplished without DC coupling to the DC amplifier with its attendant problems of stability and drift.

FIG. 3 is a schematic circuit diagram of one form of DC amplifier suitable for use in carrying out the objects of the present invention. The lines or conductors passing between the circuits of FIGS. 2 and 3 are labeled A–A′ through F–F′ where the primed letters designate lines or conductors in FIG. 3 corresponding with the same but unprimed letters in FIG. 2.

The DC amplifier of FIG. 3 comprises a first differential or input amplifier stage utilizing transistors 102 and 103, a second cascaded differential stage utilizing transistors 104 and 105, a complementary pair driver stage utilizing transistors 106 and 107, and an output power complementary pair stage utilizing transistors 108 and 109. Input transistor 102 of the input differential pair receives the DC input signal over conductor 101 from the demodulator described above, at base 110. Transistor 103 is coupled to transistor 102 by the common connection of emitters 111 and 114 to resistor 116 which in turn is returned to negative line 59 through resistor 58. Collector 112 is connected to load resistor 117 and collector 113 is connected to load resistor 118. Load resistors 117 and 118 are joined at one end and connected to positive bias line 71 through resistor 119. The base bias on base 115 is provided at the junction between resistors 120 and 121 which are two resistors in a series string connected between positive line 71 and negative line 59 and including resistors 119, 120, 121, 122 (shunted by 123), 124 and 58. The second differential stage transistors 104 and 105 receive amplified signals from the first stage from the connections between base 125 and collector 113 and base 126 and collector 112. Emitters 127 and 128 are connected together and to emitter resistor 132 which is returned to negative line 59. Collector 129 is connected directly to positive line 71 and collector 130 is connected through load resistor 131 to positive line 71. The signals amplified by this second differential stage are taken off single-ended from collector 130 over conductor 133 to base 134 of transistor 106. The complementary transistors 106 and 107 are bridged in series from positive line 71 to negative line 59. Emitter 135 is connected to positive line 71, emitter 136 is connected through resistor 137 and diodes 138 and 139 to collector 140 and emitter 142 is connected through resistor 143 to negative line 59. The bias on base 141 is derived from the junction between resistors 144 and 145 bridged between positive line 71 and negative line 59. With the input signal, as described above, for this stage applied to base 134 the series circuit including transistors 106 and 107 acts as a phase-splitter for driving output transistors 108 and 109 over lines 146 and 147 connected to bases 148 and 149 respectively. The drop across diodes 138 and 139 provides initial forward bias to bases 148 and 149 for substantially eliminating cross-over distortion in a differential output signal. These diodes also provide a certain degree of temperature compensation. The power output transistors 108 and 109 are bridged from positive line 71 to negative line 59. The series bridging circuit starting at line 71 passes through overload current limiting resistor 150 to collector 151; from emitter 152 through resistors 153 (shunted by resistor 154) and 155 to emitter 156; and from collector 157 through overload current limiting resistor 158 to negative line 59. Output is taken from the junction between resistors 153 and 155 by means of terminal 159 and terminal 160 connected to common line 53. Output terminal 159 corresponds with output terminal 6 of FIG. 1.

FIG. 3 thus shows the completion of the circuit in accordance with the present invention by showing the detailed circuitry of a DC amplifier which may supply the DC amplifier function of DC amplifier 5 of FIG. 1. The remote final balancing also described in connection with FIG. 1 above is provided by adjustable resistor 162 connected between the junction of resistors 122 and 123 over conductor 161 and ground G (which may be taken to be the same as common line 53 also grounded to G). In FIG. 3 temperature sensitive resistor 123 provides the temperature compensation provided by resistor 33 of FIG. 1. Here in FIG. 3 it is seen how the balance circuit provides means for a small adjustment of the bias on base 115 and how the adjustable portion of the circuit in the form of resistor 162 may be located external to the amplifier proper. It has been found that slight unbalance conditions in the input bridge modulator (FIGS. 1 and 2) results in a slightly unbalanced or unsymmetrical DC signal and that this condition can be countered by resistor 162 providing a highly accurate balance of the final DC output signal at output terminal 159. The effect of temperature sensitive resistor 123 is to tend to maintain this final balance in the presence of temperature changes. The total result is an extremely sensitive, very high gain DC amplifying system with a very high degree of temperature stability.

Figure 4:
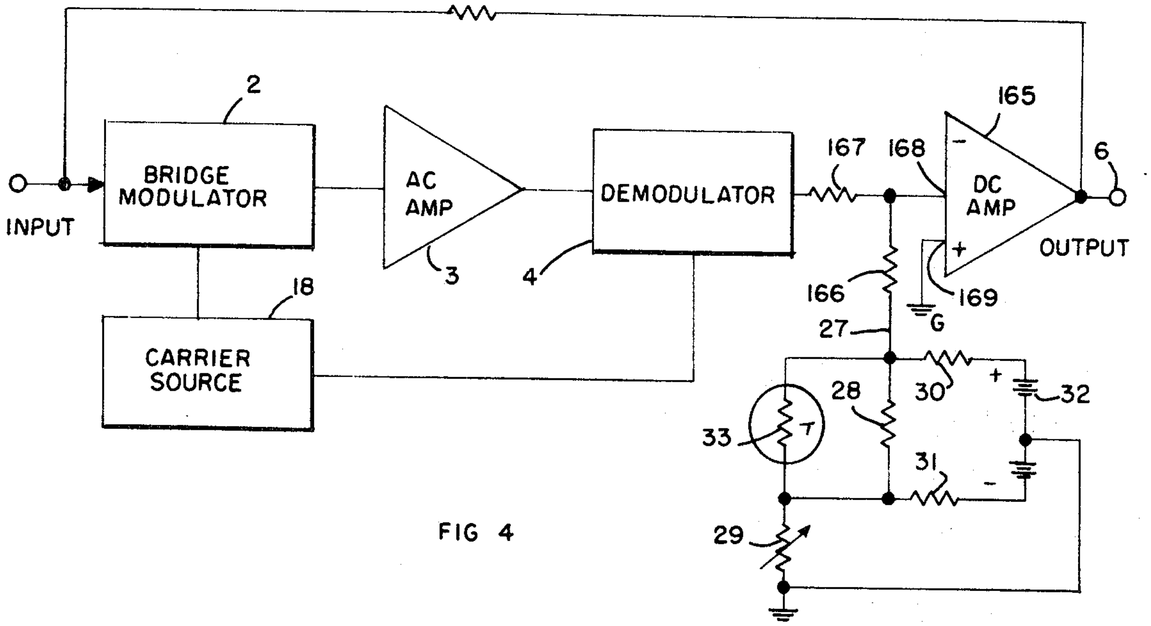
FIGS. 4, 5 and 6 are modified forms of portions of the present invention.

While the external balancing arrangement has been described above in connection with a differential input DC amplifier, this same balancing circuit can be applied to a a single-ended input to the DC amplifier 165 as shown in FIG. 4. The balancing circuitry including parts 27 through 33 function as described above. The coupling to the DC amplifier 165 is to the inverting input 168 through resistor 166 and the demodulator output is coupled to the same inverting input 168 through another resistor 167. The non-inverting input 169 in this case is returned to ground G.

Figure 5:
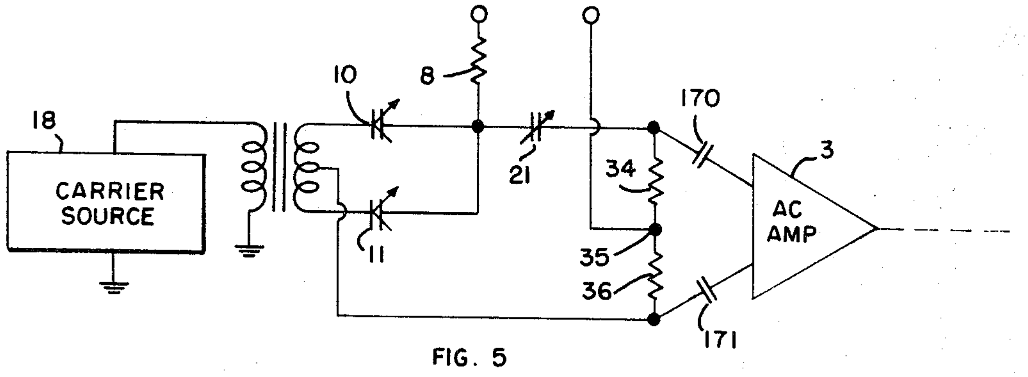

FIG. 5 shows another modification of the circuit described in detail above in which the coupling transformer 22–23 (FIG. 1) is replaced by capacitor coupling provided by capacitors 170 and 171 coupling opposite ends of resistors 34 and 36 to the input of AC amplifier 3. This coupling is also aperiodic permitting some frequency change in carrier source 18 without adversely affecting the operation of the system.

Figure 6:
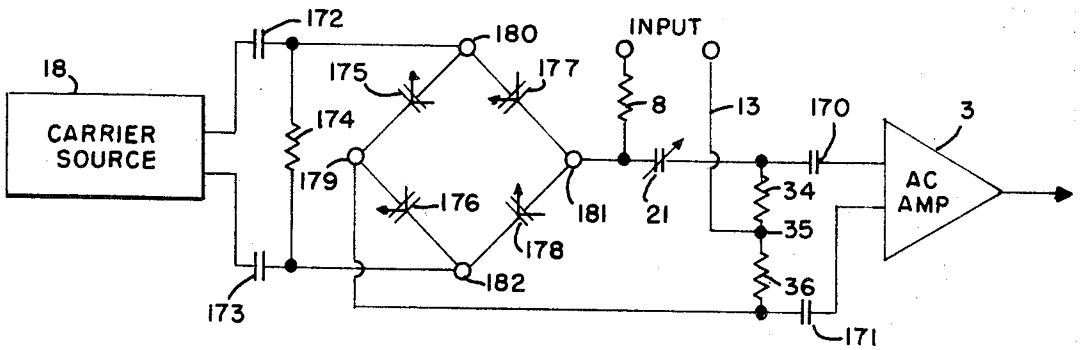

FIG. 6 shows how the varactor bridge can be modified to permit capacitor coupling of both the carrier through capacitors 172 and 173 and the output through capacitors 170 and 171 to the AC amplifier 3. The varactor bridge is made up of voltage variable diode capacitors 175, 176, 177 and 178 connected between the four bridge terminals 180, 179, 182 and 181. A DC path in the form of resistor 174 is connected across the carrier terminals 180 and 182 to which the carrier is also applied by means of capacitors 172 and 173. The AC output is taken between terminals 179 and 181 through capacitors 170 and 171 and secondary bridge balancing capacitor 21. The input signals are applied through input resistor 8 to terminal 181 and over lead 13 to the junction 35 between resistors 34 and 36. It will be noted that opposite terminals of diodes 177 and 178 are connected to the output/input terminal 181, so that input signals vary the capacitance of diodes 177 and 178 in opposite directions.

While only one form with a few modifications of the present invention have been shown and described, many modifications will be apparent to those skilled in the art and within the spirit and scope of the invention as set forth, in particular, in the appended claim.

I claim:

1. In a DC input to DC output feedback amplifier system, including in combination;

a varactor bridge circuit including first input means for receiving signals to be amplified, second input means for receiving a carrier signal and an aperiodic output means;

a source of carrier signals coupled to said second input means;

an alternating current amplifier including input means coupled to said bridge output means and including output means;

synchronous demodulator means including first input means coupled to said output means of said alternating current amplifier, second input means coupled to said source of carrier signals and including output means;

a DC amplifier including input means coupled to said output means of said demodulator means and including output means;

DC voltage bias means connected to said DC amplifier input means including adjustable resistance means for varying the net DC voltage applied to said DC amplifier input means for countering DC bias applied from said demodulator means;

and temperature responsive resistor means connected to said bias means for countering net DC bias drift at the DC amplifier input means;

wherein said combination exhibits a high open loop gain between said first input means of said varactor bridge and said output means of said DC amplifier and is adapted to operate with a closed loop gain substantially determined by degenerative feedback resistance means coupled between said output means of said DC amplifier and said first input means of said varactor bridge.

References Cited

UNITED STATES PATENTS

| | | | |
|---|---|---|---|
| 3,327,235 | 6/1967 | Hull | 330—30 X |
| 2,985,840 | 8/1961 | Theodore et al. | 329—50 X |
| 3,363,189 | 1/1968 | Oswald | 330—10 X |

FOREIGN PATENTS

| | | |
|---|---|---|
| 1,273,785 | 9/1961 | France. |

NATHAN KAUFMAN, Primary Examiner

U.S. Cl. X.R.

330—10